(12) United States Patent
Casavant

(10) Patent No.: US 6,594,806 B1
(45) Date of Patent: Jul. 15, 2003

(54) SYSTEM AND METHOD FOR PERFORMING TIMING ANALYSIS, INCLUDING ERROR DIAGNOSIS, SIGNAL TRACKING AND CLOCK SKEW

(75) Inventor: Albert E. Casavant, Belle Mead, NJ (US)

(73) Assignee: NEC Corporation, Tokyo (JP)

( * ) Notice: Subject to any disclaimer, the term of this patent is extended or adjusted under 35 U.S.C. 154(b) by 156 days.

(21) Appl. No.: 09/588,539

(22) Filed: Jun. 7, 2000

Related U.S. Application Data

(60) Provisional application No. 60/186,750, filed on Mar. 3, 2000.

(51) Int. Cl.[7] ............................................... G06F 17/50
(52) U.S. Cl. ............................................................ 716/6
(58) Field of Search ........................................ 716/5, 6

(56) References Cited

U.S. PATENT DOCUMENTS 5,157,277 A * 10/1992 Tran et al. .................. 327/156

OTHER PUBLICATIONS

Borriello, G., "Formalized timing diagrams", Mar. 1992, IEEE, pp. 372–377.*
Harris, D., "Timing Analysis Including Clock Skew", Nov. 1999, IEEE, pp. 1608–1618.*

* cited by examiner

Primary Examiner—Ha Nguyen
Assistant Examiner—Stacy A Whitmore
(74) Attorney, Agent, or Firm—Sughrue Mion, PLLC

(57) ABSTRACT

A method for performing timing analysis comprising inputting circuit timing information for a circuit, including temporal constraints between events of a desired circuit operation. A timing diagram representing the desired circuit operation, based on the circuit timing information is generater. All violated constraints within said timing diagram are identified. The method forces no violations of said violated constraints by designating the violated constraints as Non-Breakable (NB) constraints, such that a time difference from a source event to a destination event which defines said NB constraint is no less than a minimum bound and no more than a maximum bound of a linear constraint representing a timing requirement between the source and the destination events.

32 Claims, 17 Drawing Sheets

INITIALIZATION  Gives minimum separation from source node to other
STEP:           nodes AND detects INFEASIBILITY.

ADJUST {
ALTERNATIVE         Find "shortest slack" solution.
ADJUSTMENT
STEP:               Adjust separations to take up slack.

At the end of each adjustment, a valid solution
                    is found, though not necessarily a max separation
                    solution.

} UNTIL (no slack found)

IF (at least one max optional edge is satisfied for
                    each node which is destination for max optional
                    edges)
                THEN
                    CONSISTENT
                ELSE
                    INCONSISTENT

FIG. 1

```
INITIALIZE ;
WHILE (Q!=EMPTY) {
   FOR (each edge e_ui) {
      t = d[ u ]+ weight [ e_ui ];
      IF (e_ui is optional) {
         n[ i ]--;
         IF (m[ i ]<t)
            m[ i ]=t;
         IF (n[ i ]= 0 AND d[ i ]> m[ i ])
            d[ i ] = m[ i ];
      }
      ELSE /* e_ui is compulsory */
         IF (d[ i ]>t)
            d[ i ]=t;
   }
}
Dequeue( );
```

Set $d[i] = \infty$, $m[i] = 0$, $n[i] = \#$ of optional edges entering node.

$d[u]$ is the shortest slack estimate for node $u$.

$n[i]$ is the number of unchecked edges entering node $i$.

$m[i]$ is the current maximum of slacks calculated for optional edges.

FIG. 4

```
Initialize separations to those
found using Bellman - Ford;
DO {
  Modify_slack_graph;
  Shortest_slack;
  Change = NO;
    FOR (each node u) {
      IF (Δu = ∞ ) {
        sepa[ u ] = ∞;
      ELSE
        IF (Δu > 0) {
          sepa[ u ] + = Δu;
          Change = YES;
      } /* ELSE* /
  } /* FOR * /
} WHILE (CHANGE = YES)
Consistency_check
```

Update weights based on latest separations.

$\Delta u$ is maximal shortest slack.

Continue iteration until no further change is possible i.e. all slacks are zero.

FIG. 5

RANGE OF TRACKING SPECIFICATION
= 2α MAX BOUND - MIN BOUND = 2α
WHICH MEANS THAT ANY NON-DASH NODE
MUST BE AT A SEPARATION OF AT MOST
+/- α WITH RESPECT TO ANOTHER NON-DASH
NODE.

- ──→  IS LOWER BOUND = α
- ---→  IS UPPER BOUND = 2α
-        IS UPPER BOUND = α
- ──→  IS LOWER BOUND = 0
- ◯     IS ADDED DUMMY NODE

SYSTEM AND METHOD FOR PERFORMING TIMING ANALYSIS, INCLUDING ERROR DIAGNOSIS, SIGNAL TRACKING AND CLOCK SKEW

CROSS REFERENCES TO RELATED APPLICATIONS

This application is an application filed under 35 U.S.C. §111 (a), claiming benefit pursuant to 35 U.S.C. §§119–120 of the filing date of the Provisional Application Serial No. 60/186,750 filed on Mar. 3, 2000, pursuant to 35 U.S.C. §111(b). The Provisional Application Serial No. 60/186,750 is incorporated herein by reference for all it discloses.

I. BACKGROUND OF THE INVENTION

1. Field of the Invention

The automation of interface timing verification is important for the design of reliable systems composed of several interconnected components. Due to manufacturing or environmental variation, the delay between two signal transitions of a component may not be a precise number, and is usually specified with a lower bound and an upper bound by the manufacturers. Exhaustive simulation, where all possible combinations of delay values are checked, is impractical for large systems. Therefore, efficient analytical verification algorithms are necessary to ensure that all timing requirements will be satisfied for all possible delay values.

2. Description of the Related Art

A convenient means for describing the timing interaction of signals and events is a timing diagram. A timing diagram is a set of signals, where each signal is composed of signal edges which represent events in time such as a transition from high to low, transition from high impedance to driven, etc. The time position of events in the timing diagram is determined by timing constraints between events. A constraint $[c_{ij}]$ (meaning a constraint between events i and j) in general has a lower bound component, lower $c_{ij}$, and an upper bound component, upper $c_{ij}$. There are many possible timing constraints between signal events with various semantic definitions, but only two types, the most common in practice, are considered here:
linear, $$\max_i(\text{time}[i] + \text{lower}[c_{ij}]) \le \text{time}[j] \le \min_i(\text{time}[i] + \text{upper}[c_{ij}]) \text{ and max,}$$

$$\max_i(\text{time}[i] + \text{lower}[c_{ij}]) <= \text{time}[j] <= \max_i(\text{time}[i] + \text{upper}[c_{ij}]).$$

In a practical context, guarantees and requirements are linear constraints and delays are max constraints.

Note that only maximum separations need be calculated, because minimum separations can be calculated by:

$$\min(\text{time}[i]-\text{time}[j])=-\max(\text{time}[j]-\text{time}[i]).$$

A timing diagram is modeled by an event graph whose nodes represent events and whose weighted directed edges are timing constraints, either linear or max. Each edge is labeled with both the lower bound and upper bound component associated with the edge.

One of the shortcomings of currently available commercial tools is that they either do not deal with guarantees and requirements, or, if they do, the results are frequently incorrect or unreliable. Many commercial tools are based on a timing analysis engine that handles only max or min timing relationships. This limits the application of these tools for describing timing guarantees, signal tracking and clock jitter, all of which require linear constraints as well as max constraints. Also, the inability to use linear constraints prevents the possibility of error diagnosis capability in timing analysis.

A previous paper, "Efficient Algorithms for Interface Timing Verification," T.-Y. Yen, A. Ishii, A. Casavant, and W. Wolf, Proceedings, European Conference on Design Automation, (EDAC), 1994, pp. 34–39, describes an algorithm for performing timing verification in designs having minimum and maximum event separations expressed using max and linear timing relationships. This algorithm is known as the "Max-Plus-Linear" (hereinafter, "MPL") Algorithm, and is described in more detail below.

Since the present invention is primarily concerned with the MPL algorithm, previous work in the algorithm area will just be touched on. However, general work in the area can be found in "Solving Linear, Min and Max constraint Systems Using CLP based on Relational Interval Arithmetic," P. Girodias, E. Cerny, and W. J. Older, Theoretical Computer Science, 1997, Vol. 173, No. 1, February, pp. 253–281; "Interface Timing Verification with Delay Correlation Using Constraint Logic Programming," P. Girodias, E. Cerny, Proceedings of the European. Design and Test Conference, 1997. pp. 12–19; "High-Level Timing Analysis using Constraint Logic Programming and Interval Arithmetic," P. Girodias and E. Cerny, Proceedings of the Canadian Conference on Electrical and Computer Engineering, Vol. 2, 1995, pp. 636–639; "Modeling and Execution of Timing Diagrams and Multi-Match Events," K. Khordoc, E. Cerny, and M. Dufresne, TAU '92; "Algorithms for Interface Timing Verification," K. L. McMillan and D. L. Dill, Proceedings of IEEE International Conference on Computer Design (ICCD), 1992, pp. 48–51; "Verification of Asynchronous Circuits Using Time Petri Net Unfolding," A. Semenov and A. Yakovlev, Proceedings of ACM IEEE Design Automation Conference, 1996, pp. 59–62; "Specification and Analysis of Timing Constraints in Signal Transition Graphs," P. Vanbekbergen, G. Goossens, and H. DeMan, Proceedings, European Conference on Design Automation, (EDAC), 1992, pp. 302–306.

Work specifically in the max plus linear realm can be found in "Interface Timing Verification With Application to Synthesis," E. A. Walkup and G. Boriello, Proceedings, Design Automation Conference, (DAC), 1994, pp. 106–112; "Algorithms for Interface Timing Verification," K. L. McMillan and D. L. Dill, Proceedings of IEEE International Conference on Computer Design (ICCD), 1992, pp. 48–51.

Work in the cyclic version of max plus linear is in "An Algorithm for Exact Bounds on the Time Separation of Events in Concurrent Systems," T. Amon, H. Hulgaard, S. M. Bums, and G. Borriello, Proceedings, IEEE International Conference on Computer Design, (ICCD), 1993, pp. 166–173; "Efficient Timing Analysis of a Class of Petri Nets." H. Hulgaard and S. M. Burns, CAV '95, LNCS 939; "Maximum Time Separation of Events in Cyclic Systems with Linear and Latest Timing Constraints," F. Jin. H. Hulguard, E. Cerny, FMCAD '98.

The details of the MPL algorithm and outlines of proofs can be found in "Efficient Algorithms for Interface Timing Verification," mentioned above. Here, a brief overview of the MPL algorithm will be given to provide background for the following discussion of the invention.

In FIG. 1, the initialization step uses a single source longest path algorithm (Bellman-Ford algorithm) described in Chapter 25 of *Introduction to Algorithms*, T. H. Cormen, C. E. Leiserson, and R. L. Rivest, McGraw Hill, 1990. In the Iterative Adjustment Step, on each iteration, a slack graph is constructed. The nodes in the slack graph are events, as in the event graph. The edges, however, represent the available slack between two events.

FIG. 2 defines bound satisfaction for upper and lower bounds. In the upper portion of FIG. 2, events A and B occur at event times $t_a$ and $t_b$, respectively. If the difference between $t_b$ and $t_a$ is less than or equal to a particular upper bound, then that upper bound is satisfied. Similarly, in the lower portion of FIG. 2, the difference between $t_b$ and $t_a$ must be greater than or equal to a particular lower bound for that bound to be satisfied.

The slack calculation for a lower bound of a max or linear constraint is shown boxed on the left of FIG. 3. All lower bounds, whether associated with linear constraints or max constraints are compulsory, meaning that they must always be satisfied.

The slack calculation for an upper bound of a max or linear constraint is shown boxed on the right of FIG. 3. The upper bounds of linear constraints are compulsory, but the upper bounds of max constraints are max-optional. Max-optional bounds may or may not be satisfied on a constraint by constraint basis. Slacks of compulsory bounds and satisfied upper bounds of max constraints have positive slack and become edges in the slack graph. In a consistent solution, at least one of the max optional bounds entering an event must be satisfied.

The shortest slack $\delta[i]$ is calculated as the minimum of the compulsory slack $\delta_c[i]$ and the max-optional slack $\delta_m[i]$ as shown in FIG. 3. A procedure based on Dijkstra's shortest path algorithm (Chapter 25 in *Introduction to Algorithms*) for calculating the shortest slack is shown in FIG. 4. The difference between ShortestSlack and the Dijkstra algorithm is within the conditional . . . IF ($e_{ui}$ is optional) . . .

In FIG. 4, t is the sum of the estimated slack of event u, d[u], and the available positive slack (weight of the edge in the slack graph). For a compulsory edge, if t is greater then the slack of event i (d([i]), then event i's slack is updated. For a max-optional edge, a running calculation of the maximum t found so far among all max-optional edges entering i is kept by m[i]. When the last max-optional edge is encountered, d[i] is updated. Note that d[i] is always set to guarantee satisfaction for all compulsory edges but only the maximum of the max-optional edges entering an event. If the priority queue is implemented with a Fibonacci heap, the complexity of ShortestSlack is O(V log V+E) where V is the number of nodes and E is the number of edges in the event graph. After running ShortestSlack, $\delta[u]$ (the actual shortest slack from source node to u) for all nodes u=d[u] (the estimate of shortest slack from source node to u).

FIG. 5 shows the MaxSeparation (iterative adjustment) algorithm. After new $\delta[u]$s are calculated, the event separations are adjusted to reflect those results. When this occurs, the slack graph previously calculated is no longer accurate and must be updated. This is done on each iteration of MaxSeparation. Some edges that were in the old slack graph are not in the new one and some edges which were not in the old slack graph are in the new one. If there is no increase in event separations on an iteration of MaxSeparation, the algorithm terminates.

Infeasibility arises if a compulsory upper bound between two events is smaller than some sequence of lower bounds between the same two events. Inconsistency arises where a lower bound of a linear constraint or a sequence of lower bounds ending in the lower bound of a linear constraint, prevents the satisfaction of any of the upper bounds of the max constraints entering an event. Another possibility is a missing upper bound on a max constraint which allows separations to increase indefinitely. Infeasibility is tested during the initialization phase as shown in FIG. 5. Inconsistency is checked in MaxSeparation as shown in FIG. 5.

II. SUMMARY OF THE INVENTION

It is an object of the present invention to provide a method and system for performing interface timing analysis, primarily at the chip macro level of IC design, or at the board level, or the gate level, which performs provably correct timing analysis. The invention implements the MPL algorithm to achieve this object and other objects as discussed below.

It is a further object of the invention to identify all violations of timing constraints within a desired operation of a particular circuit, and to overcome these constraint violations by setting a guaranteed value for them. Cumulative delays which are created earlier in the circuit operation as a result of this object of the invention are absorbed by the strategic replacement or redesign of the circuit(s) in question.

It is a still further object of the invention to increase circuit design flexibility by taking advantage of events which occur within a certain time period of one another, due to environmental parameters of the circuit such as process, voltage and/or temperature variations. The invention accomplishes this object by designating such a set of events, and thereafter constraining each event within the set of events so that their relative delays are a set and known quantity. These events can include, but are not limited to, events such as those which vary according to a duty cycle variation of a clock phase generator and/or clock buffer delays.

III. BRIEF DESCRIPTION OF THE DRAWINGS

The invention will be more clearly understood from the following description in conjunction with the accompanying drawing, wherein:

FIG. 1 is a pseudo-code representation of the MPL algorithm.

FIG. 4 is a pseudo-code representation of a procedure for determining the shortest slack between events according to the MPL algorithm.

FIG. 5 is a pseudo-code representation for the MaxSeparation (Iterative Adjustment) portion of the MPL algorithm.

IV. DETAILED DESCRIPTION OF THE PREFERRED EMBODIMENTS

Figure 2:
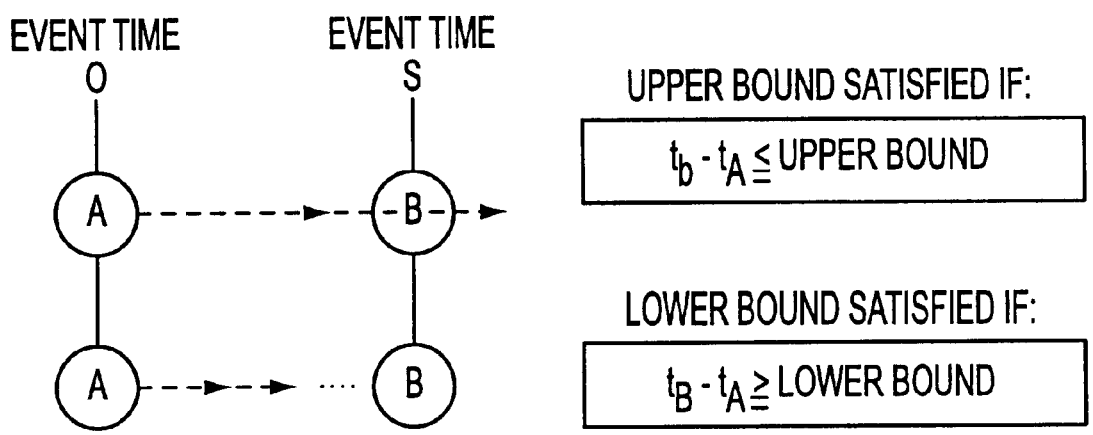
FIG. 2 is a diagram which defines bound satisfaction for upper and lower bounds.
Figure 3:
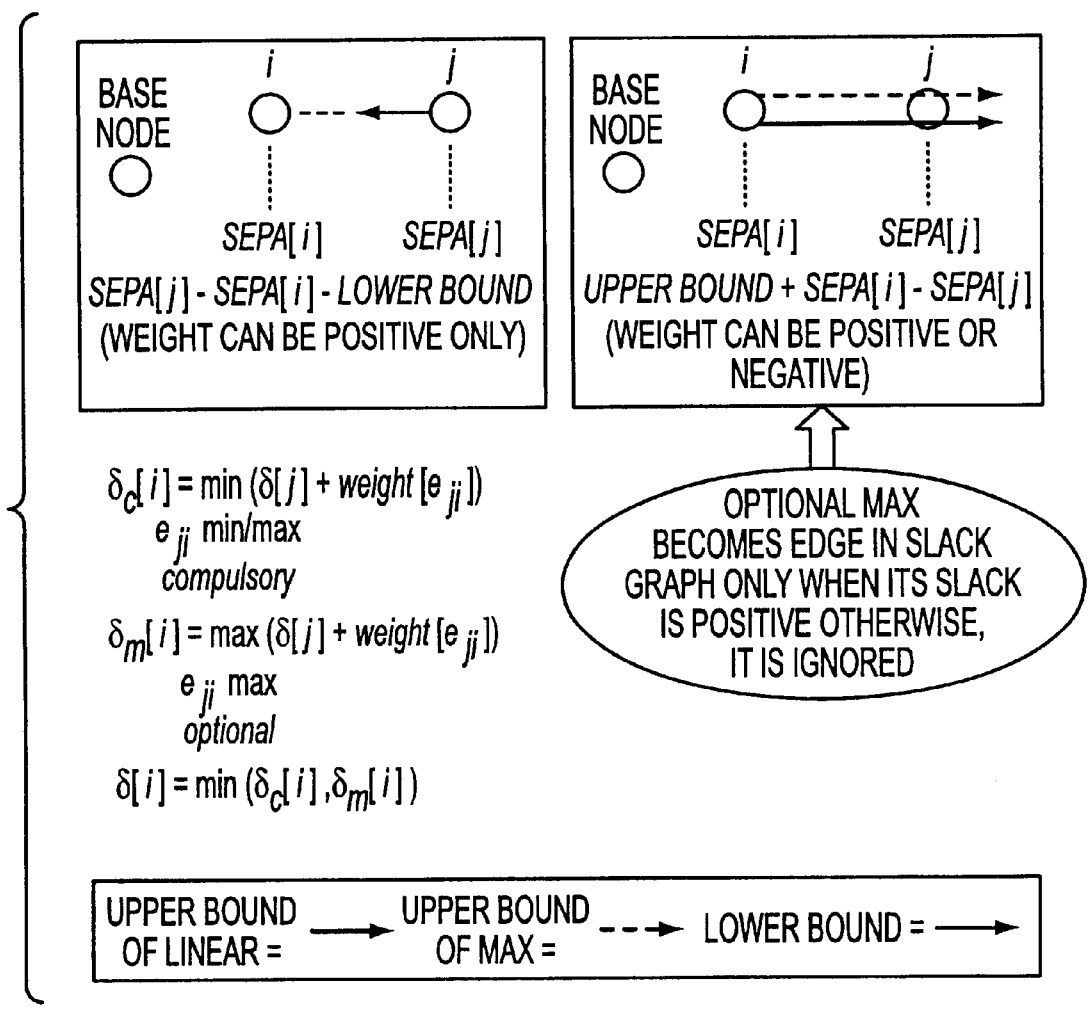
FIG. 3 is a diagram for the construction of a slack graph, including a slack calculation for a lower and upper bound of a max or linear constraint.
Figure 6:
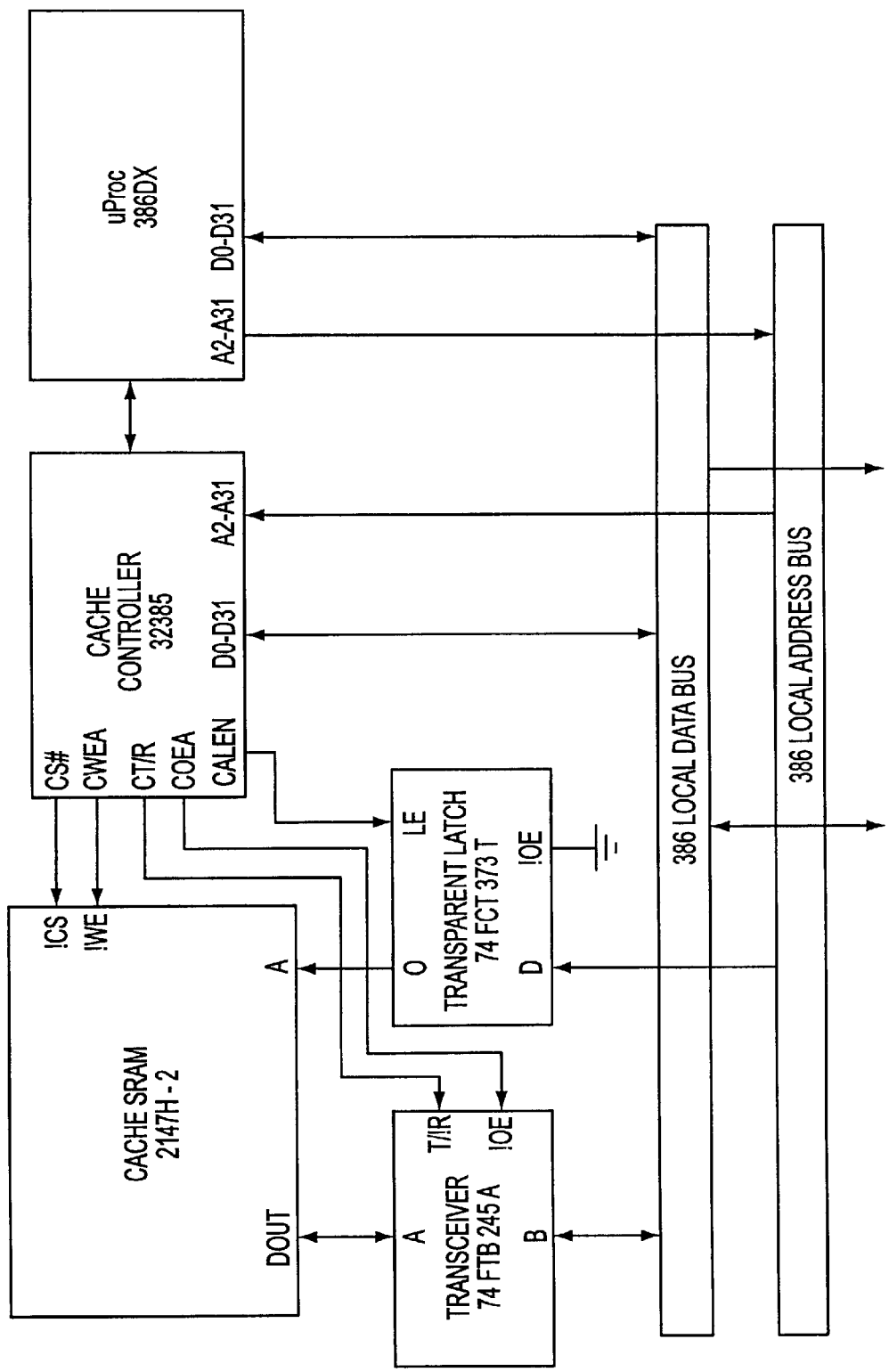
FIG. 6 is an exemplary hardware configuration for demonstrating an example of the present invention.

Error diagnosis will be illustrated using a cache read hit bus cycle for an Intel 80386 system. The hardware configuration used in the example is shown in FIG. 6. The 386 microprocessor issues a read request which is routed to the cache controller (32385). The cache controller determines that the data value needed is currently in the cache and enables the transparent latch (74 FCT 373 T) to pass the address to the cache SRAM (2147H-2). Also enabled is a transceiver (74 FTB 245 A) at the output of the SRAM which then makes the data value available on the 386 local data bus for the microprocessor to read at its data ports.

Figure 7:
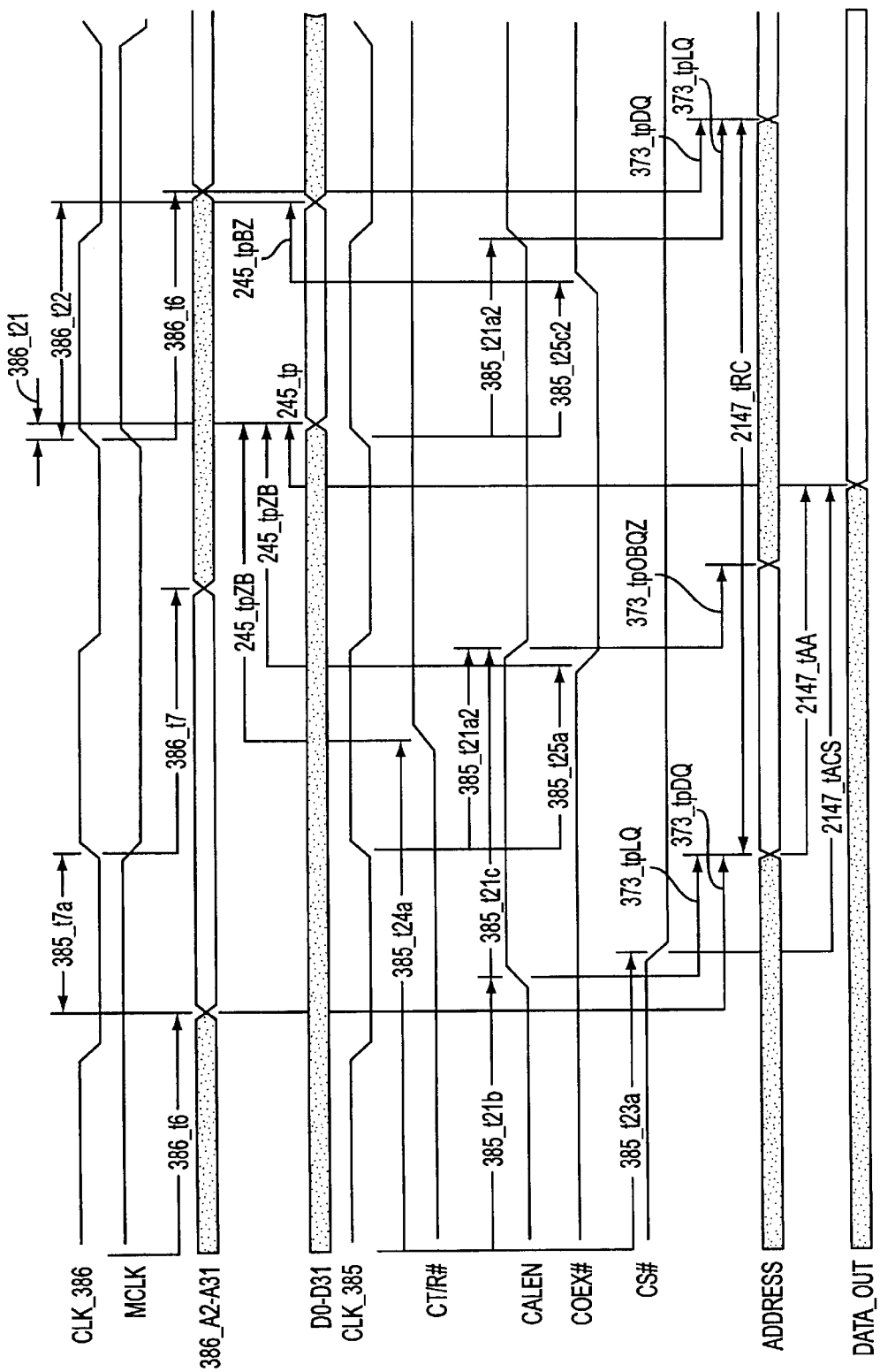
FIG. 7 is a timing diagram demonstrating a circuit operation of the exemplary hardware configuration shown in FIG. 6.

Using the data sheets for the parts specified above, a timing diagram shown in FIG. 7 was created. On the top line of the figure, a violated min bound setup time 386_t21 (between the D0–D31 data inputs of the microprocessor and the microprocessor clock) is shown. The lower and upper bounds of some relevant constraints in this example are given in Table 1. The setup time is a timing requirement which in this case is forced to be negative, indicating that delays and guarantees preceding the timing requirement are too large. As shown in Table 1, the setup requirement is 11 ns, but the actual separation is −1.5 ns. In the present invention, timing requirements can be violated unless they are explicitly specified as not violatable.

TABLE 1

Constraint Upper and Lower Bounds

| Constraint Name | Lower Bound | Upper Bound |
| --- | --- | --- |
| 386_t21 | 11 | |
| 245_tp | 2 | 7.5 |
| 385_t23a | 12 | 37 |
| 385_t21b | 3 | 34 |
| 2147_tAA(slow) | 0 | 45 |
| 2147_tACS(slow) | 0 | 45 |
| 373_tpLQ(slow) | 3 | 15 |
| 2147_tAA(fast) | 0 | 35 |
| 2147_tACS(fast) | 0 | 35 |
| 373_tpLQ(fast) | 1.5 | 10.5 |

The first step in error diagnosis, after identifying constraint violations, is to force no violations of these violated constraints, i.e. the time difference from the source to the destination of the constraint cannot be less than the minimum bound nor more than the maximum bound of a linear constraint representing a timing requirement (setup in this case). Note that one but not both of these bounds can be unspecified. To force no violation of a constraint, the user can change the constraint type to NB (non-breakable).

Figure 8:
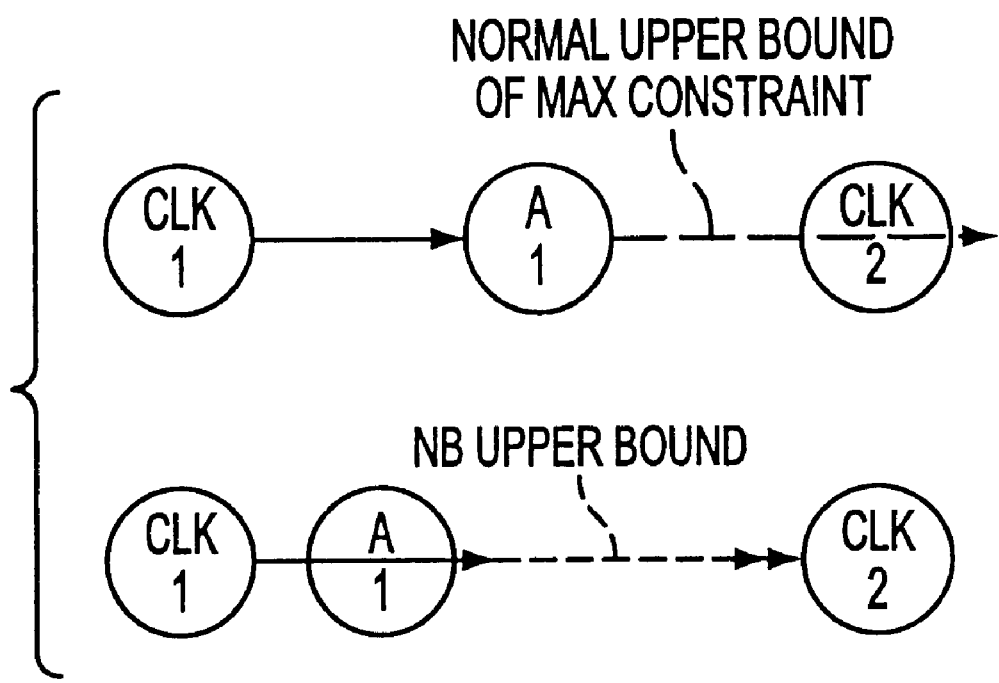
FIG. 8 is a diagram which demonstrates the definition of Non-Breakable Constraints.

The upper part of FIG. 8 shows a violated upper bound. When the constraint type of the violated constraint is changed to NB, preceding upper bounds now overshoot i.e. there is available slack in the bound. Overshoots in this context are called delay violations. The assumption is that in the worst case timing situation, max bounds of delays cannot be violated, and all requirements or guarantees must be associated with event separations between their min and max bounds. Event A in the lower part of FIG. 8 can be forced earlier in time to the point where the separation between CLK and A is the same as a min bound. If there were more events in the chain, more separations could be determined by min bounds until some overshoot remains or an infeasibility occurs.

Figure 9:
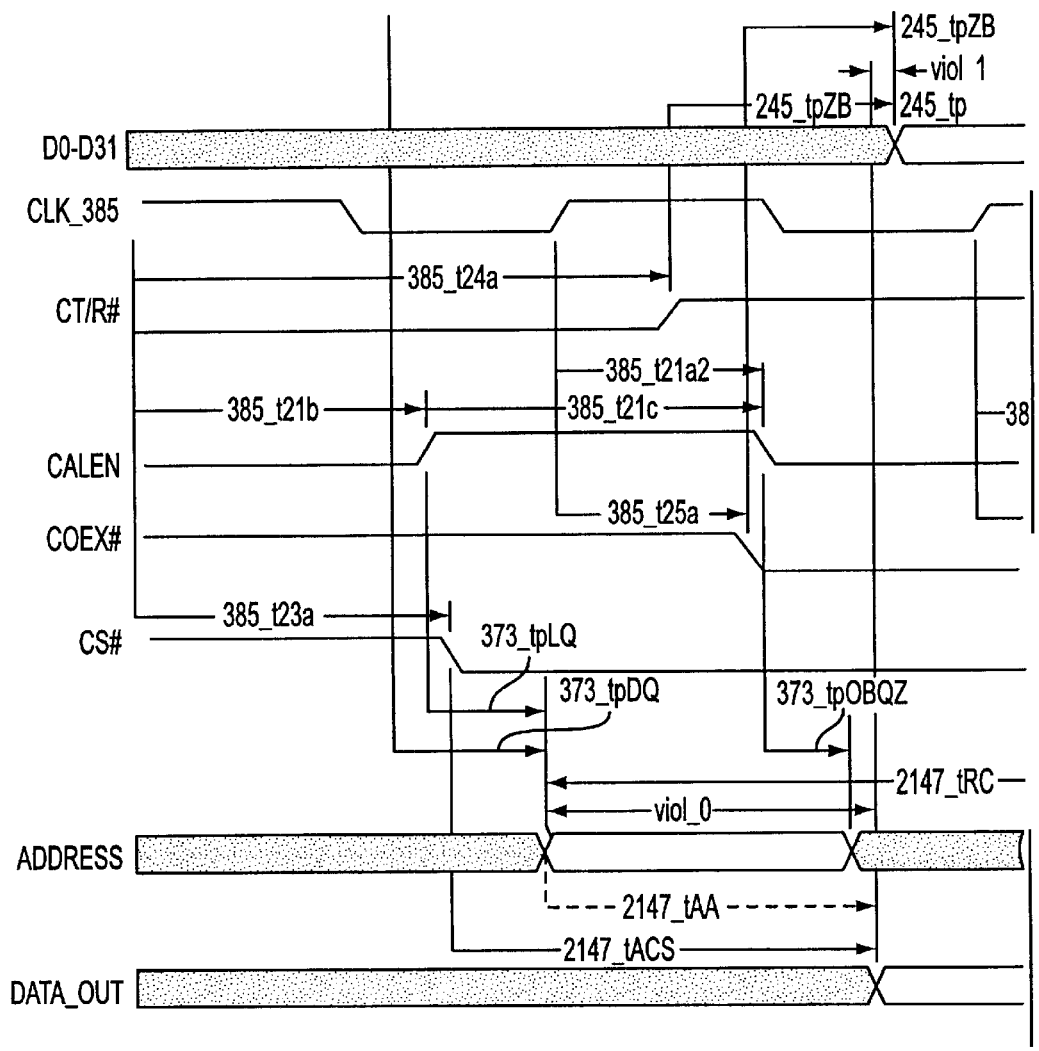
FIG. 9 is a blown-up portion of FIG. 7 after the placement of a Non-Breakable Constraint.

FIG. 9 shows the effect of making 386_t21 non-breakable in the example. Two overshoots are shown as viol_1 (at the upper right of FIG. 9) and viol_0 (in lower center) in the figure. The actual separation shown by viol_1 is 2 ns. 245_tp has an upper bound of 7.5 ns, so the overshoot is 5.5 ns. The actual separation shown by viol_0 is 38 ns. 2147_tAA has an upper bound of 45 ns, so the overshoot is 7 ns. Enforcing the NB constraint pushes 245 tp to its lower bound, and it in turn pushes 2147_tAA to a value between its lower and upper bound, and no further forced pushing is possible.

Faced with constraint violations and delay violations, the designer probably has a good idea where he/she can "absorb" a decrease in the maximum bound of a delay and suffer the least negative effect on design goals. There may be a particular part of the circuit where speeding it up is less expensive than speeding up some other part. This may be the case where a hard macro is used. Speeding up would involve the selection of a new macro which may be difficult or impossible. It may be a case of substituting a faster RAM or adding some extra buffering which may be accomplished with less cost or inconvenience. To aid the user in making these decisions, the present invention has the ability to jam delays i.e. enforce the maximum bound of the delay.

Figure 10:
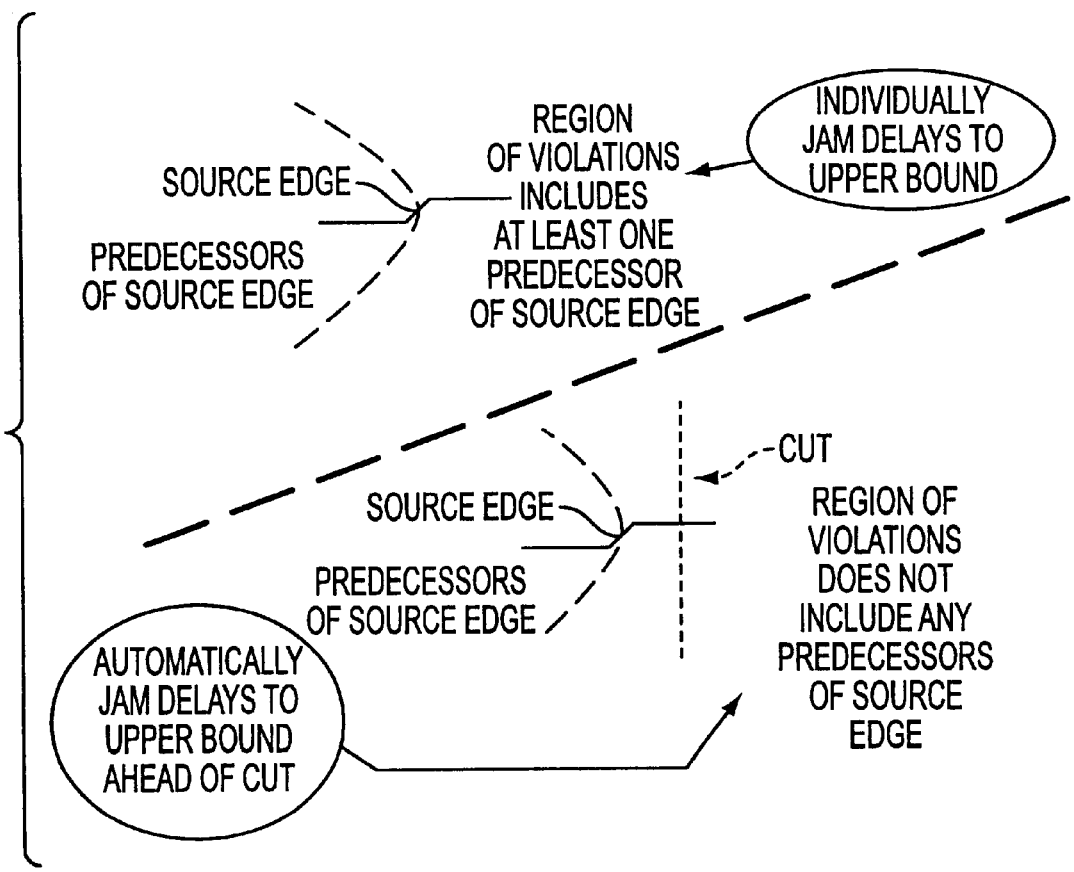
FIG. 10 is a diagram of two different jamming modes according to the present invention, both with and without the use of a cut.

Two modes of jamming of delays contemplated by the present invention are shown in FIG. 10. Cut mode (lower half of FIG. 10) should be the preferred mode if it is legal to use it. A source edge is the base event from which all maximum separations are determined by one use of the MPL algorithm. To use cut mode, no delay violations may be predecessors of the source edge. The designer specifies a "cut," i.e. a bisection of the timing graph where all waveform or clock edges to the left of the cut are predecessors of waveform or clock edges on the right of the cut. The edges bisected by the cut are the cut edges.

The present invention respects all NBs specified by the designer and also jams (i.e. makes the minimum bound of the delay equal to the maximum bound) all delays to the right of the cut edges. This has the effect of forcing the delays along the cut boundary to absorb delay violations. These are the delays that the designer intends to use to reduce or eliminate all constraint and delay violations. Sometimes, due to the minimum bounds of delays, delay violations will be forced to the left of the cut boundary. This is an indication that the designer has placed the cut too far to the left in the timing diagram. Sometimes, also due to minimum bounds, a cut may produce an infeasible solution. In this case, the designer should move the cut farther to the right, because absorption cannot be supported at the current cut position. Note that in circuits having requirements which are forced to be met and guarantees that must always be met, the determination of the slacks of edges at the cut boundary requires using an analysis algorithm such as MPL because the problem could not reliably be solved by hand.

Figure 11:
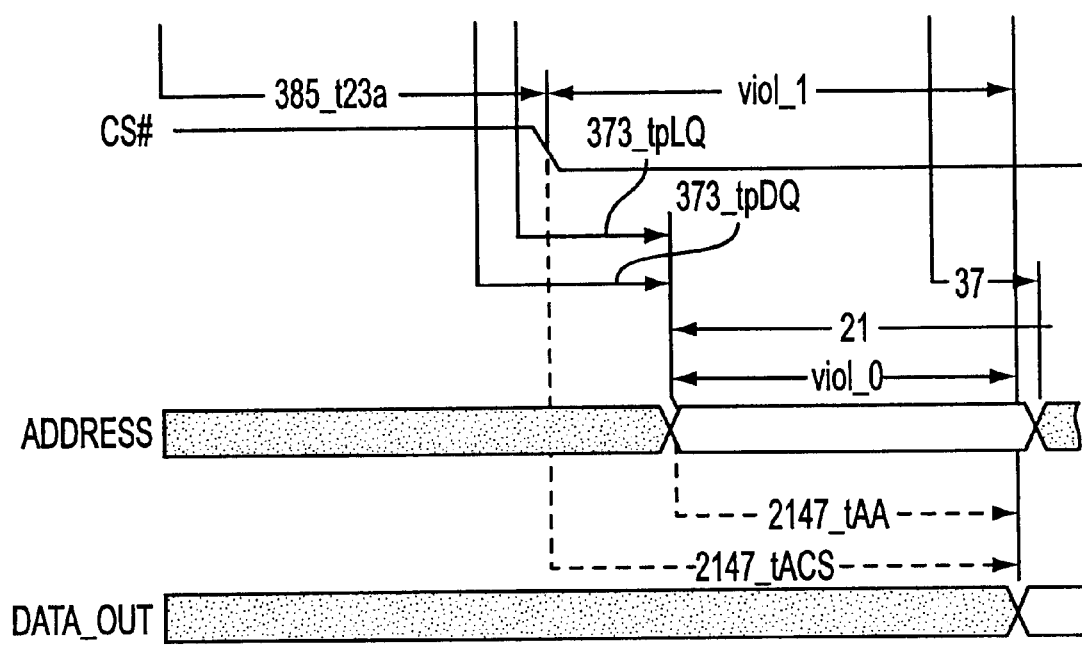
FIG. 11 is a blown-up portion of FIGS. 7 and 9 after the placement of a cut.

The effect of using cut mode on the example is shown in FIG. 11. The cut puts Source-CS#-ADDRESS events on left of cut. Viol__1 (at the upper right of the figure) represents the overshoot of the max bound of 2147__tACS and viol__0 (center right of the figure) represents the overshoot of the max bound of 2147__tAA. The actual separation shown by viol__0 is 32.5 ns, yielding an overshoot of the upper bound of 2147__tAA of 45−32.5=12.5 ns. The actual separation shown by viol__1 is 44.5 ns, yielding an overshoot of the upper bound of 2147__tACS of 45−44.5=0.5 ns. The designer may have had in mind using a faster memory when he/she decided to create a cut at Source-CS4-ADDRESS, but the present invention shows that even with the fastest memory available having 2147 tAA of [0,35], there would still be overshoot involving the upper bound of 2147__tAA. The designer must select a faster transparent latch. The next faster 373 latch has a 373__tpLQ delay of [1.5, 10.5]. Using this latch and a faster memory is sufficient to meet the 386__t21 setup time of 11 ns with 2 ns to spare.

Figure 12:
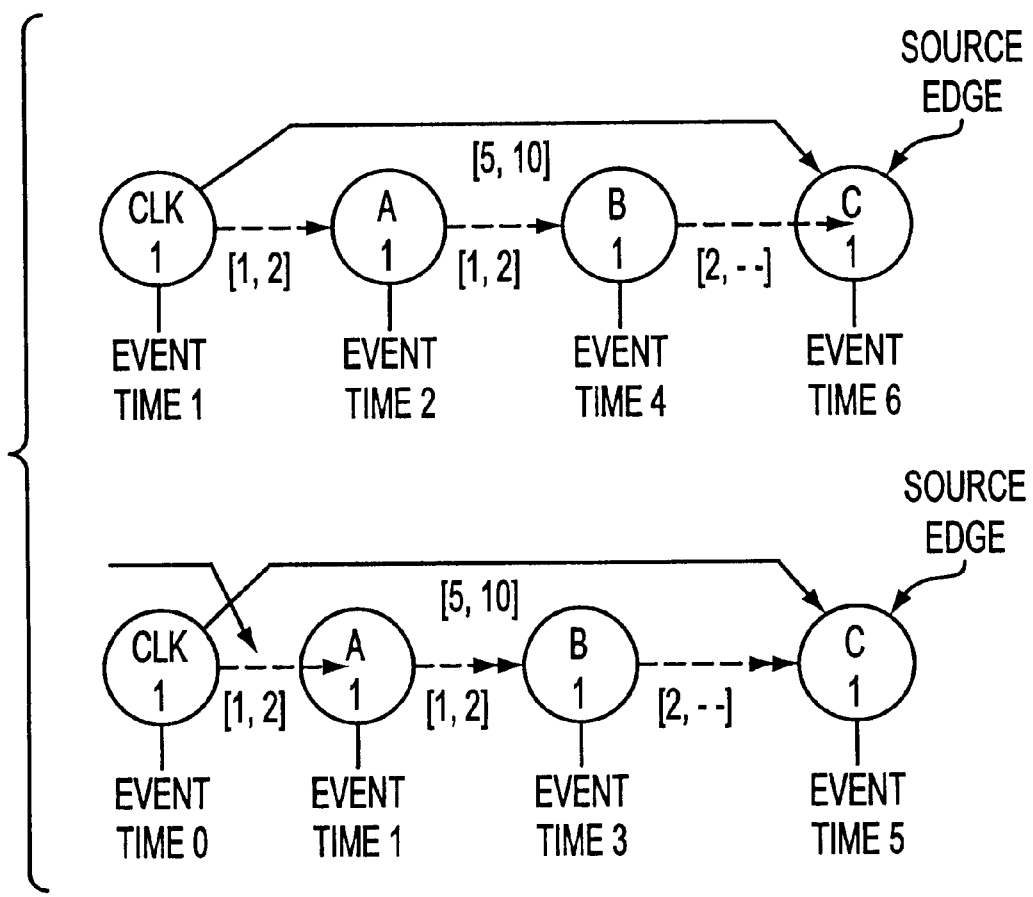
FIG. 12 is a diagram demonstrating the manual jam mode of the present invention.

If delay violations are present in the predecessors of the source edge when the violated constraint is made NB, then cut mode cannot be used. In this case manual jam mode is available. FIG. 12 shows the effect of adding a jam property to the [1,2] delay. The user can continue to jam delays and analyze the results until the absorbing delay is in the position that he/she desires. The same caveats regarding infeasibility that applied to cut mode apply here as well.

Figure 13:
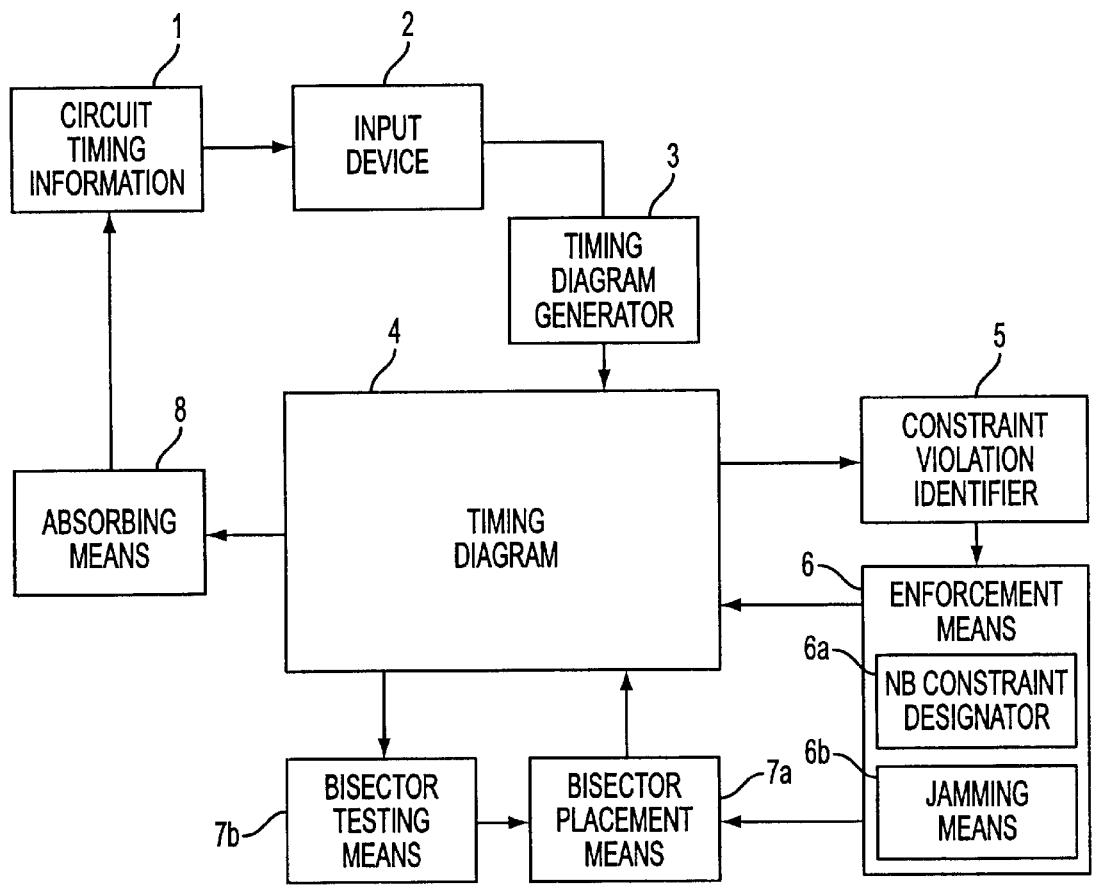
FIG. 13 is a block diagram demonstrating an exemplary embodiment of the present invention for performing error diagnosis.

FIG. 13 is a block diagram demonstrating the features discussed above. In FIG. 13, circuit timing information 1 is input into timing diagram generator 3 via input device 2. Timing diagram generator 3 thereafter generates timing diagram 4. Constraint violation identifier 5 identifies all of the violated constraints within timing diagram 4, an enforcement means 6 corrects these constraint violations using NB constraint designator 6a. Together with jamming means 6b, delays are forced to the left in timing diagram 4, and bisector placement means 7a places a cut at an appropriate location within timing diagram 4, as discussed above. Bisector testing means 7b tests the placement of the cut for errors, such as infeasibility, and informs the bisector placement means 7a if the cut must be placed again at a more appropriate location. Finally, absorbing means 8 absorbs the delay(s) created by the above process, and alters the circuit timing information 1 accordingly.

Turning to another feature of the present invention, signal tracking is used to model waveform edges whose event times track because they are on the same integrated circuit or because they are exposed to the same environmental conditions. In the present invention, a set of signals can be specified, all of whose members must track according to a tracking specification.

The inability to take signal tracking into account in timing analysis leads to the selection of overly pessimistic design parameters. In other words, a circuit designer who does not account for signal tracking will perceive the need for (and will therefore use) faster, more expensive parts than if signal tracking were taken into account. This is because events that are constrained to track have less freedom of movement in time; thus, surrounding events can more easily meet their timing specifications.

Figure 14:
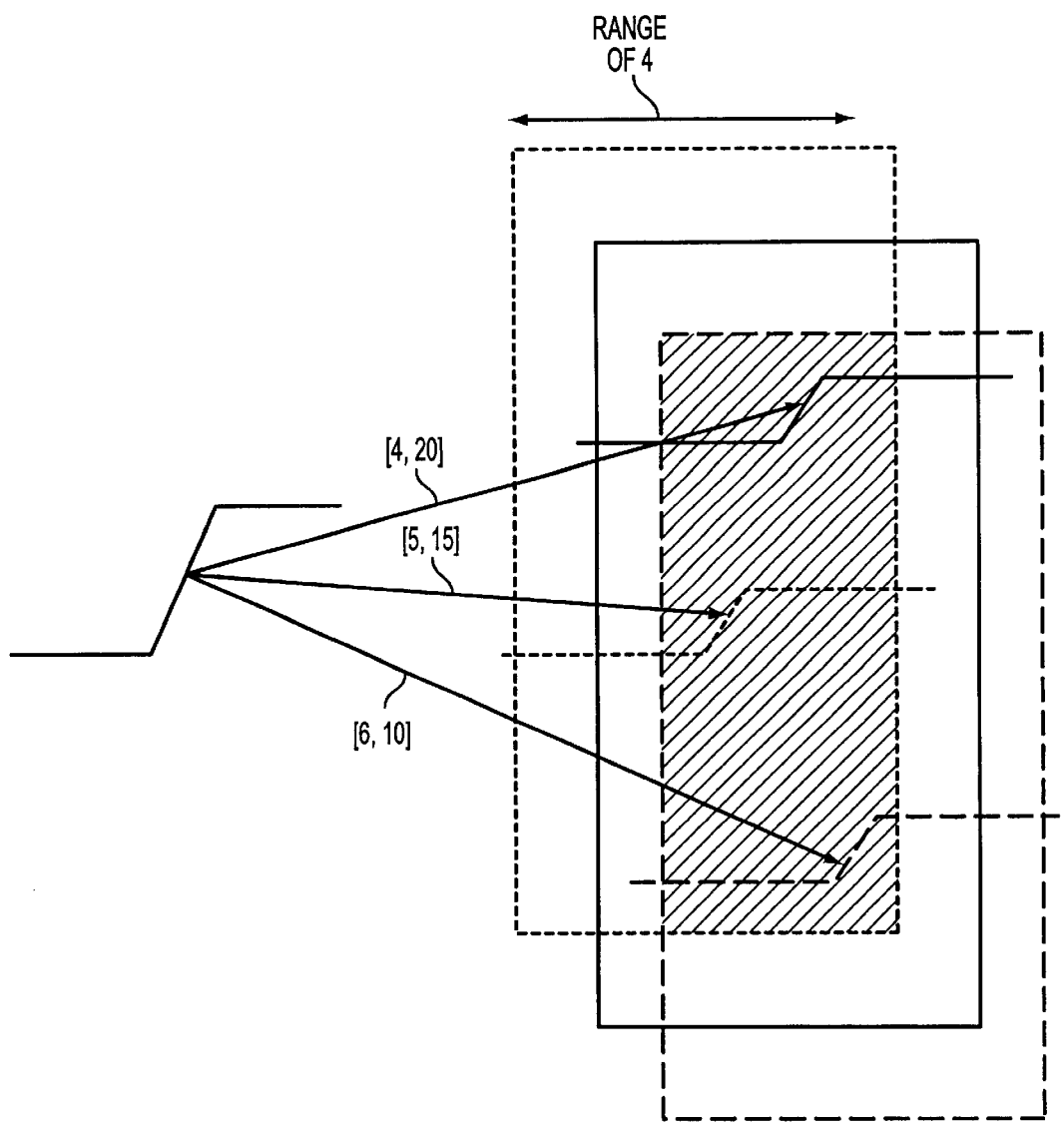
FIG. 14 is a diagram demonstrating the effect of signal tracking.

FIG. 14 shows the effect of signal tracking. Even though the absolute event time variation of the waveform edges shown can be quite large, signal tracking forces all the edges adhering to the same tracking specification to fall within a narrow time envelope with respect to each other. Each waveform edge has an envelope represented by a rectangle in FIG. 14. The intersection of the envelopes for all the signals gives the legal range of times for all of the signals taken together. The signals in this small example do fall within the intersection zone. Since signal tracking is implemented using guarantees (linear constraints), there are only two outcomes of timing analysis—the tracking specification is met or there is infeasibility.

Figure 15:
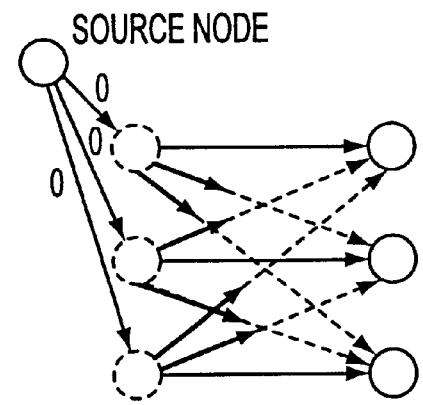
FIG. 15 is a diagram demonstrating an implementation of signal tracking in the context of the timing analysis of the present invention.

The implementation of signal tracking in the context of the underlying timing analysis engine of the present invention is shown in FIG. 15. Modeling of signal tracking depends heavily on the use of linear constraints. New dummy events depicted as dashed circles are added corresponding to each member event of the signal tracking set. Between a dashed circle and its corresponding real event, an "equal" constraint is placed, i.e. the lower bound and upper bound of a linear constraint are both $\alpha$, one-half of the range of the tracking specification of $+/-\alpha$. The dummy events exactly track the corresponding real event at a time a earlier. The dummy event can then be the source of constraints that force the other real events to be a minimum of 0 and a maximum of $2\alpha$ separation from the dummy event. It is then easy to see that for a particular real event, all other events are constrained to be within $+/-\alpha$ separation from it. This is done for all events in the signal tracking set so that the entire set meets the tracking specification.

Figure 16:
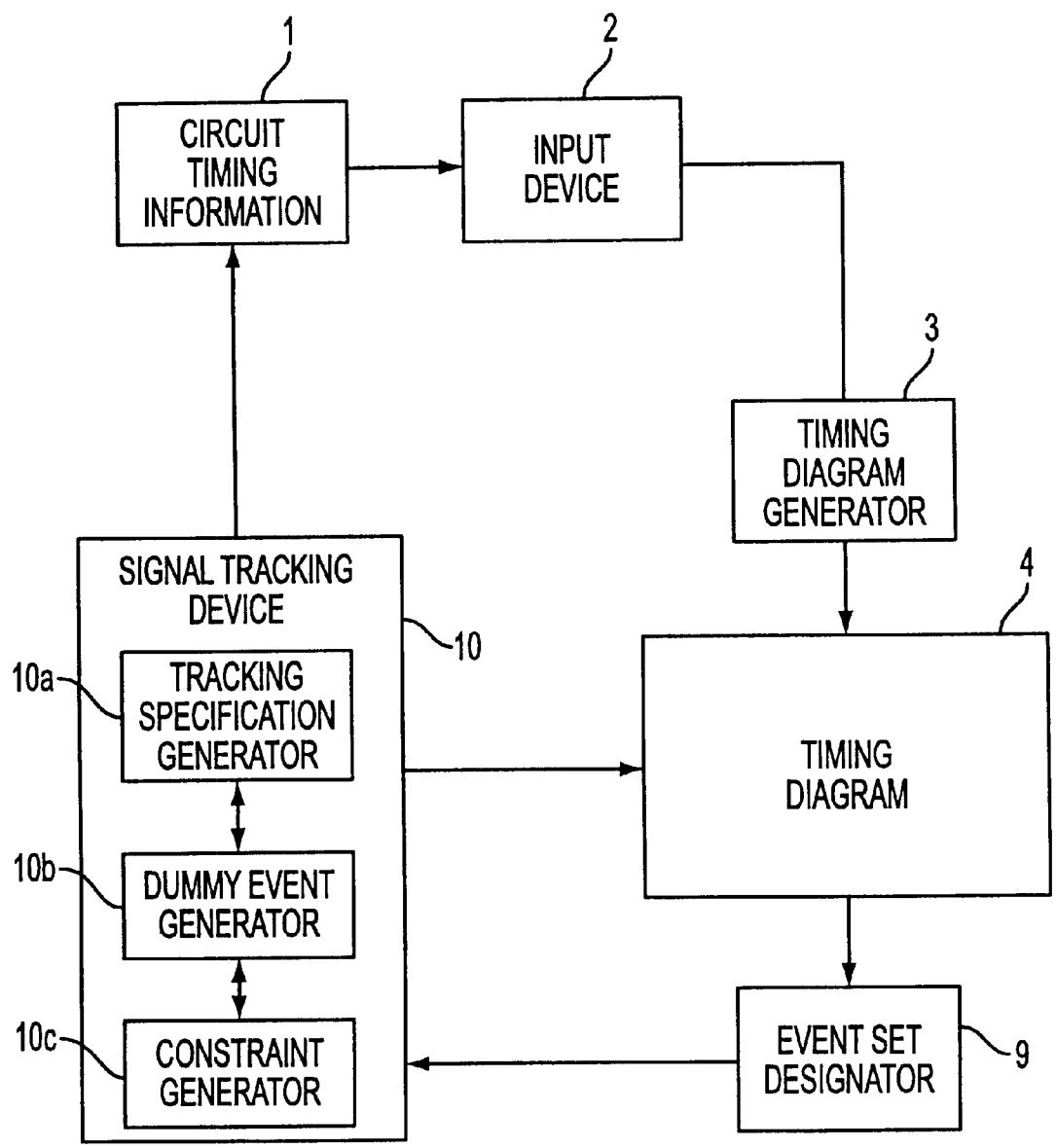
FIG. 16 is a block diagram demonstrating an exemplary embodiment of the present invention for performing signal tracking in the context of the timing analysis of the present invention.

FIG. 16 demonstrates a block diagram for the signal tracking feature of the present invention. As in FIG. 13, circuit timing information 1 is input into timing diagram generator 3 via input device 2. Timing diagram generator 3 thereafter generates timing diagram 4. Event set designator 9 designates a set of events within timing diagram 4 which track one another, and which will be constrained to take advantage of this tracking. Signal tracking device 10 enforces an appropriate constraint by generating a tracking specification with tracking specification generator 10a. Dummy event generator 10b generates dummy events within the generated tracking specification, and constraint generator 10c constrains the events within the designated set of events relative to the dummy events and to one another, as described above. Note that elements 5–8 of FIG. 13 can of course be used in conjunction with the just-described features of the invention.

Figure 17:
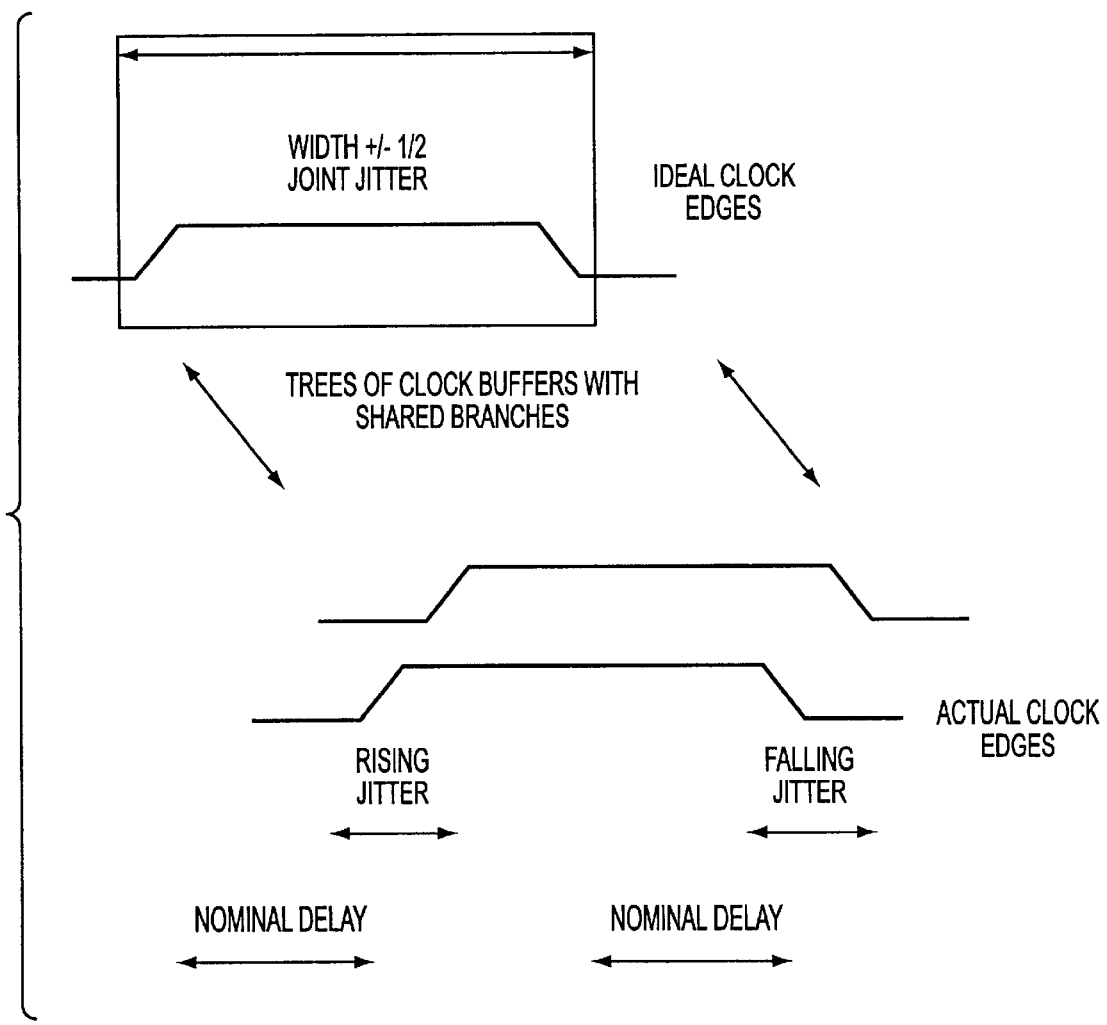
FIG. 17 is a diagram demonstrating the effect of clock skew, or jitter.

Clock skew is shown in FIG. 17. The interpretation given to rising jitter, falling jitter and joint jitter by the present invention is as follows. Rising jitter models signal tracking of clock buffer delays for the rising edge of the clock. Falling jitter models signal tracking of clock buffer delays for the falling edge of the clock. Duty cycle variation is modeled as a constraint on the ideal (i.e., before added buffering) rising and falling clock edges. Joint jitter models signal tracking of the circuit components used to create phases of the clock and hence is a signal tracking which applies to both rising and falling edges.

The same amount of jitter is applied to all edges of a particular type, either rising or falling. If individual specification of rising jitter or falling jitter is desired for a subset of edges, then the designer should declare new waveforms and relate those waveforms to the basic ideal clock. Offset measures the time shift of clock events from the source time event.

Rising and falling jitter are modeled by signal tracking. In general, there are clock buffer trees rooted at ideal clock edges. The leaves are the actual clock edges, i.e. the edges connected to memory elements. Since the actual clock edges may share branches in the clock buffer tree and the buffers are in general on the same integrated circuit, the event times of the actual clock edges track. The modeling of rising and falling jitter is done using signal tracking where the "equal" constraints are set to a nominal delay and the actual clock edges are allowed to "jitter" relative to one another from nominal delay$-\alpha$ to nominal delay$+\alpha$. There may be several clock buffer chains and each must be modeled by a possibly different rising or falling jitter. Since there is usually only one clock phase generator on a chip, signal tracking within the clock phase generator is modeled using the ideal clock edges rather than the actual edges. Joint jitter is used for this purpose. Since the range of falling jitter event times and the range of rising jitter event times are not overlapping except in exceptional cases (not treated by the modeling techniques being discussed here), the effect of joint jitter can be modeled as a linear constraint between the actual rising and falling edges. Instead of doing this, it can be combined with an existing linear constraint between the ideal rising and falling clock edges as described below.

Hence, the upper bound of the linear constraint between ideal rising and falling edges of the clock is: nominal width of clock pulse+increase in width due to duty cycle variation$-\frac{1}{2}$ joint jitter. Similarly, the lower bound is: nominal width of clock pulse$-$decrease in width due to duty cycle variation$+\frac{1}{2}$ joint jitter. Joint jitter thus has the effect of lessening the range of event times of the actual falling clock edge with respect to the actual rising clock edge by indirectly using the ideal clock edges modified by duty cycle variation.

In conclusion, the MPL algorithm can be used for interface timing verification and gate level timing verification in the presence of process, voltage and temperature variations. In general, linear constraints and their role in expressing signal tracking both make an important contribution towards properly modeling clock skew. Linear constraints in conjunction with max constraints provide the ability to accurately and provably verify the results of timing analysis, and to correct these results as necessary.

What is claimed is:

1. A method for performing timing analysis comprising:
   (a) inputting circuit timing information for a circuit, including temporal constraints between events of a desired circuit operation;
   (b) generating a timing diagram representing said desired circuit operation, based on said circuit timing information;
   (c) identifying all violated constraints within said timing diagram; and
   (d) forcing no violations of said violated constraints by designating the violated constraints as Non-Breakable (NB) constraints, such that a time difference from a source event to a destination event which defines said NB constraint is no less than a minimum bound and no more than a maximum bound of a linear constraint representing a timing requirement between said source and said destination events.

2. A method for performing timing analysis as recited in claim 1, further comprising the step of:
   (e) absorbing the effects of step (d) by increasing a speed of portions of said circuit corresponding to events which precede said NB constraints on said timing diagram.

3. A method for performing timing analysis as recited in claim 1, further comprising the steps of:
   (e) bisecting said timing diagram, such that all waveform or clock edges which are left of the point of bisection are predecessors of waveform or clock edges which are right of the point of bisection; and
   (f) jamming all delays to the right of said point of bisection, such that a minimum bound of each such delay is equal to a maximum bound of that delay.

4. A method for performing timing analysis as recited in claim 3, further comprising the steps of:
   (g) determining whether steps (e) and (f) result in either delay violations which are to the left of said point of bisection or infeasible solutions, and, if so, moving said point of bisection to the right in said timing diagram and repeating steps (e) and (f) until neither delay violations which are to the left of said point of bisection or infeasible solutions occur; and
   (h) absorbing the effects of steps (e)–(g) by increasing a speed of portions of said circuit by decreasing maximum bounds of delays cut by the point of bisection and thereby absorbing excess delay.

5. A method for performing timing analysis as recited in claim 1, further comprising the steps of:
   (e) individually jamming delays within said timing diagram, such that a minimum bound of each delay is equal to a maximum bound of that delay, until an absorbing delay is in a desired position; and
   (f) absorbing the effects of step (e) by increasing a speed of portions of said circuit by decreasing maximum bounds of delays cut by the point of bisection and thereby absorbing excess delay.

6. A method for performing timing analysis, comprising:
   (a) inputting circuit timing information for a circuit, including temporal constraints between events of a desired circuit operation;
   (b) generating a timing diagram representing said desired circuit operation, based on said circuit timing information;
   (c) designating a set of events within said timing diagram; and
   (d) causing each of the events within said set of events to occur within a predetermined time of one another,
   wherein step (d) further comprises:
       (d-1) determining a range of time around each event within said set of events; and
       (d-2) causing said events within said set of events to occur within a an intersection of the time ranges.

7. A method for performing timing analysis, comprising:
   (a) inputting circuit timing information for a circuit, including temporal constraints between events of a desired circuit operation;
   (b) generating a timing diagram representing said desired circuit operation, based on said circuit timing information;
   (c) designating a set of events within said timing diagram; and
   (d) causing each of the events within said set of events to occur within a predetermined time of one another,
   wherein step (d) further comprises the steps of:
       (d-1) defining a tracking specification having a range of $+/-\alpha$ for each event within said set of events;
       (d-2) adding dummy events corresponding to each of said events within said set of events;
       (d-3) setting an equal constraint between a dummy event and its corresponding real event, such that said dummy event exactly tracks its corresponding real event at time $\alpha$ earlier;
       (d-4) setting said dummy event as a source of constraints forcing all of the other events within said set of events, besides the event corresponding to said dummy event, to have a minimum of 0 and a maximum of 2α separation from said dummy event; and (d-5) repeating steps (d-3) and (d-4) for each remaining dummy event wherein α is a real number.

8. A method for performing timing analysis comprising:
(a) inputting circuit timing information for a circuit, including temporal constraints between events of a desired circuit operation;
(b) generating a timing diagram representing said desired circuit operation, based on said circuit timing information;
(c) designating a set of events within said timing diagram;
(d) causing each of the events within said set of events to occur within a predetermined time of one another,
(e) identifying all violated constraints within said timing diagram and
(d) forcing no violations of said violated constraints by designating the violated constraints as Non-Breakable (NB) constraints, such that a time difference from a source event to a destination event which defines said NB constraint is no less than a minimum bound and no more than a maximum bound of a linear constraint representing a timing requirement between said source and said destination events.

9. A method for performing timing analysis as recited in claim 8, further comprising the step of:
(e) absorbing the effects of step (d) by increasing a speed of portions of said circuit corresponding to events which precede said NB constraints on said timing diagram.

10. A method for performing timing analysis as recited in claim 8, further comprising the steps of:
(e) bisecting said timing diagram, such that all waveform or clock edges which are left of the point of bisection are predecessors of waveform or clock edges which are right of the point of bisection; and
(f) jamming all delays to the right of said point of bisection, such that a minimum bound of each delay is equal to a maximum bound of that delay.

11. A method for performing timing analysis as recited in claim 10, further comprising the steps of:
(g) determining whether steps (e) and (f) result in either delay violations which are to the left of said point of bisection or infeasible solutions, and, if so, moving said point of bisection to the right in said timing diagram and repeating steps (e) and (f) until neither delay violations which are to the left of said point of bisection or infeasible solutions occur; and
(h) absorbing the effects of steps (e)–(g) by increasing a speed of portions of said circuit by decreasing maximum bounds of delays cut by the point of bisection and thereby absorbing excess delay.

12. A method for performing timing analysis as recited in claim 8, further comprising the steps of:
(e) individually jamming delays within said timing diagram, such that a minimum bound of each delay is equal to a maximum bound of that delay, until an absorbing delay is in a desired position; and
(f) absorbing the effects of step (e) by increasing a speed of portions of said circuit by decreasing maximum bounds of delays cut by the point of bisection and thereby absorbing excess delay.

13. A method for performing timing analysis, comprising:
(a) inputting circuit timing information for a circuit, including temporal constraints between events of a desired circuit operation;
(b) generating a timing diagram representing said desired circuit operation, based on said circuit timing information;
(c) designating a set of events within said timing diagram; and
(d) causing each of the events within said set of events to occur within a predetermined time of one another,
wherein step (c) further comprises:
(c-1) defining a first set of events as actual rising clock edges which vary from ideal rising clock edges due to clock buffer delays acting on said actual rising clock edges; and
(c-2) defining a second set of events as actual falling clock edges which vary from ideal falling clock edges due to clock buffer delays acting on said actual falling clock edges.

14. A method for performing timing analysis as recited in claim 13, wherein the predetermined time in step (d) is determined based on common branches of buffer trees and proximity of a set of buffers on an integrated circuit.

15. A method for performing timing analysis, comprising:
(a) inputting circuit timing information for a circuit, including temporal constraints between events of a desired circuit operation;
(b) generating a timing diagram representing said desired circuit operation, based on said circuit timing information;
(c) designating a set of events within said timing diagram; and
(d) causing each of the events within said set of events to occur within a predetermined time of one another,
wherein step (c) further comprises:
(c-1) defining said set of events as actual rising clock edges and actual falling clock edges which vary from ideal rising and falling clock edges due to imperfections in a clock phase generator of said circuit which cause duty cycle variations and joint jitter of all clock edges within the circuit.

16. A method for performing timing analysis as recited in claim 15, wherein the predetermined time in step (d) is determined based on each of said actual falling clock edges relative to a corresponding one of said actual rising clock edges, by using the ideal clock edges modified by said duty cycle variation and joint jitter variation.

17. A system for performing timing analysis comprising:
an input device for inputting circuit timing information for a circuit, including temporal constraints between events of a desired circuit operation;
a timing diagram generator for generating a timing diagram representing said desired circuit operation, based on said circuit timing information;
an identifier for identifying all violated constraints within said timing diagram and
a Non-Breakable (NB) constraint designator for designating the violated constraints as NB constraints, thereby forcing no violations of said violated constraints, such that a time difference from a source event to a destination event which defines said NB constraint is no less than a minimum bound and no more than a maximum bound of a linear constraint representing a timing requirement between said source and said destination events.

18. A system for performing timing analysis as recited in claim 17, further comprising:
an absorbing means which increases a speed of portions of said circuit corresponding to events which precede said NB constraints on said timing diagram, thereby absorbing any excess delays in said circuit, including delays created by said NB constraints.

19. A system for performing timing analysis as recited in claim 17, further comprising:
  a bisector placement means for bisecting said timing diagram, such that all waveform or clock edges which are left of the point of bisection are predecessors of waveform or clock edges which are right of the point of bisection; and
  a jamming means for jamming all delays to the right of said point of bisection, such that a minimum bound of each such delay is forced to be equal to a maximum bound of that delay.

20. A system for performing timing analysis as recited in claim 19, further comprising:
  a bisector testing means for determining the presence of either delay violations which are to the left of said point of bisection or infeasible solutions, wherein said bisector placement means places said point of bisection at a new position further right in said timing diagram in response to the output of said bisector testing means; and
  an absorbing means for increasing a speed of portions of said circuit corresponding to decreasing maximum bounds of delays cut by the bisection, thereby absorbing all excess delay along the point of bisection.

21. A system for performing timing analysis as recited in claim 17, further comprising:
  a jamming means for individually jamming delays within said timing diagram, such that a minimum bound of each delay is equal to a maximum bound of that delay, until an absorbing delay is in a desired position; and
  an absorbing means for increasing a speed of portions of said circuit by decreasing maximum bounds of delays at said desired position.

22. A system for performing timing analysis, comprising:
  an input device for inputting circuit timing information for a circuit, including temporal constraints between events of a desired circuit operation;
  a timing diagram generator for generating a timing diagram representing said desired circuit operation, based on said circuit timing information;
  an event set designator for defining a set of events within said timing diagram; and
  a signal tracking device which causes each of the events within said set of events to occur within a predetermined time of one another,
  wherein said signal tracking device is operative to determine a range of time around each event within said set of events, and to cause said events within said set of events to occur within an intersection of the time ranges.

23. A system for performing timing analysis, comprising:
  an input device for inputting circuit timing information for a circuit, including temporal constraints between events of a desired circuit operation;
  a timing diagram generator for generating a timing diagram representing said desired circuit operation, based on said circuit timing information;
  an event set designator for defining a set of events within said timing diagram; and
  a signal tracking device which causes each of the events within said set of events to occur within a predetermined time of one another,
  wherein said signal tracking device further comprises:
    a tracking specification generator which generates a tracking specification having a range of $\pm/-\alpha$ for each event within said set of events;
    a dummy event generator for generating dummy events corresponding to each of said events within said set of events; and
    a constraint generator which generates an equal constraint between a dummy event and its corresponding real event, such that said dummy event exactly tracks its corresponding real event at time $\alpha$ earlier, and which sets said dummy event as a source of constraints forcing all of the other events within said set of events, besides the event corresponding to said dummy event, to have a minimum of 0 and a maximum of $2\alpha$ separation from said dummy event, wherein $\alpha$ is a real number.

24. A system for performing timing analysis comprising:
  an input device for inputting circuit timing information for a circuit, including temporal constraints between events of a desired circuit operation;
  a timing diagram generator for generating a timing diagram representing said desired circuit operation, based on said circuit timing information;
  an event set designator for defining a set of events within said timing diagram;
  a signal tracking device which causes each of the events within said set of events to occur within a predetermined time of one another, and
  an identifier for identifying all violated constraints within said timing diagram and
  a Non-Breakable (NB) constraint designator for designating the violated constraints as NB constraints, thereby forcing no violations of said violated constraints such that a time difference from a source event to a destination event which defines said NB constraint is no less than a minimum bound and no more than a maximum bound of a linear constraint representing a timing requirement between said source and said destination events.

25. A system for performing timing analysis as recited in claim 24, further comprising:
  an absorbing means which increases a speed of portions of said circuit corresponding to events which precede said NB constraints on said timing diagram, thereby absorbing any excess delays in said circuit, including delays created by said NB constraints.

26. A system for performing timing analysis as recited in claim 25, further comprising:
  a bisector placement means for bisecting said timing diagram, such that all waveform or clock edges which are left of the point of bisection are predecessors of waveform or clock edges which are right of the point of bisection; and
  a jamming means for jamming all delays to the right of said point of bisection, such that a minimum bound of each such delay is forced to be equal to a maximum bound of that delay.

27. A system for performing timing analysis as recited in claim 26, further comprising:
  a bisector testing means for determining the presence of either delay violations which are to the left of said point of bisection or infeasible solutions, wherein said bisector placement means places said point of bisection at a new position further right in said timing diagram in response to the output of said bisector testing means; and an absorbing means for increasing a speed of portions of said circuit corresponding to decreasing maximum bounds of delays cut by the bisection, thereby absorbing all excess delay along the point of bisection.

28. A system for performing timing analysis as recited in claim 25, further comprising:

an enforcement means for individually jamming delays within said timing diagram, such that a minimum bound of each delay is equal to a maximum bound of that delay, until an absorbing delay is in a desired position; and an absorbing means for increasing a speed of portions of said circuit corresponding to decreasing maximum bounds of delays at said desired position.

29. A system for performing timing analysis, comprising:

an input device for inputting circuit timing information for a circuit, including temporal constraints between events of a desired circuit operation;

a timing diagram generator for generating a timing diagram representing said desired circuit operation, based on said circuit timing information;

an event set designator for defining a set of events within said timing diagram; and a signal tracking device which causes each of the events within said set of events to occur within a predetermined time of one another, wherein said event step designator designates a first set of events as actual rising clock edges which vary from ideal rising clock edges due to clock buffer delays on said actual rising clock edges, and further designates a second set of events as actual falling clock edges which vary from ideal falling clock edges due to clock buffer delays acting on said actual falling clock edges.

30. A system for performing timing analysis as recited in claim 29, wherein said predetermined time is determined based on common branches of buffer trees and proximity of a set of buffers on an integrated circuit.

31. A system for performing timing analysis, comprising:

an input device for inputting circuit timing information for a circuit, including temporal constraints between events of a desired circuit operation;

a timing diagram generator for generating a timing diagram representing said desired circuit operation, based on said circuit timing information;

an event set designator for defining a set of events within said timing diagram; and a signal tracking device which causes each of the events within said set of events to occur within a predetermined time of one another, wherein said event set designator designates said set of events as actual rising clock edges and actual falling clock edges which vary from ideal rising and falling clock edges due to imperfections in a clock phase generator of said circuit which cause duty cycle variations and joint jitter of all clock edges within the circuit.

32. A system for performing timing analysis as recited in claim 31, wherein said predetermined time is determined based on each of said actual falling clock edges relative to a corresponding one of said actual rising clock edges, by using the ideal clock edges modified by said duty cycle variation and joint jitter variation.

\* \* \* \* \*